(12) United States Patent
Koo et al.

(10) Patent No.: US 8,421,060 B2
(45) Date of Patent: Apr. 16, 2013

(54) RECONFIGURABLE LOGIC DEVICE USING SPIN ACCUMULATION AND DIFFUSION

(75) Inventors: Hyun Cheol Koo, Seoul (KR); Suk Hee Han, Seoul (KR); Joon Yeon Chang, Seoul (KR); Hyung Jun Kim, Seoul (KR); Jang Hae Ku, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 364 days.

(21) Appl. No.: 12/684,586

(22) Filed: Jan. 8, 2010

(65) Prior Publication Data

US 2011/0042648 A1 Feb. 24, 2011

(30) Foreign Application Priority Data

Aug. 21, 2009 (KR) .................. 10-2009-0077622

(51) Int. Cl.
*H01L 29/82* (2006.01)
*H01L 29/66* (2006.01)
(52) U.S. Cl.
USPC 257/24; 257/E29.323; 257/192; 257/E29.168; 257/295; 977/755; 977/762; 977/933; 977/937; 326/7; 326/47; 326/49
(58) Field of Classification Search .............. 257/24, 257/192, E29.323, E29.168, 295; 977/755, 977/762, 93, 937, 933; 326/7, 47, 49
See application file for complete search history.

(56) References Cited

U.S. PATENT DOCUMENTS

| 5,498,888 | A | * | 3/1996 | Ozawa | ............... 257/295 |
|---|---|---|---|---|---|
| 5,629,549 | A | | 5/1997 | Johnson | |
| 5,654,566 | A | | 8/1997 | Johnson | |
| 6,297,987 | B1 | * | 10/2001 | Johnson et al. | ............... 365/158 |
| 6,885,577 | B2 | * | 4/2005 | Tang et al. | ............... 365/158 |
| 6,956,269 | B1 | * | 10/2005 | Vashchenko et al. | ......... 257/421 |
| 7,020,013 | B2 | * | 3/2006 | Johnson | ............... 365/158 |
| 7,064,976 | B2 | * | 6/2006 | Johnson | ............... 365/158 |
| 7,161,218 | B2 | * | 1/2007 | Bertin et al. | ............... 257/415 |
| 7,598,578 | B2 | * | 10/2009 | Nakamura et al. | ............ 257/421 |
| 7,602,636 | B2 | * | 10/2009 | Saito et al. | ............... 365/158 |
| 7,772,630 | B2 | * | 8/2010 | Saito | ............... 257/295 |
| 7,869,266 | B2 | * | 1/2011 | Ranjan et al. | ............... 365/158 |
| 7,994,555 | B2 | * | 8/2011 | Koo et al. | ............... 257/295 |
| 8,058,676 | B2 | * | 11/2011 | Kim et al. | ............... 257/295 |
| 2003/0227807 | A1 | | 12/2003 | Nakamura et al. | |
| 2005/0237792 | A1 | * | 10/2005 | Johnson | ............... 365/158 |
| 2005/0282379 | A1 | | 12/2005 | Saito et al. | |

(Continued)

FOREIGN PATENT DOCUMENTS

| KR | 2003 0078751 | 10/2003 |
|---|---|---|
| KR | 2006 0048384 | 5/2006 |
| KR | 10 0612884 | 8/2006 |

*Primary Examiner* — Michael Shingleton
(74) *Attorney, Agent, or Firm* — Renner, Otto, Boisselle & Sklar, LLP (57) ABSTRACT

A logic device includes: a substrate having a channel layer; two input terminal patterns of ferromagnetic material formed on the substrate and spaced apart from each other along a longitudinal direction of the channel layer so as to serve as the input terminals of a logic gate; and an output terminal pattern of ferromagnetic material formed on the substrate and disposed between the two input terminal patterns to serve as an output terminal of the logic gate. The output terminal pattern reads an output voltage by using spin accumulation and diffusion of electron spins which are injected into the channel layer from the input terminal patterns.

16 Claims, 7 Drawing Sheets

U.S. PATENT DOCUMENTS

| | | |
|---|---|---|
| 2006/0145806 A1 | 7/2006 | Kim et al. |
| 2007/0007568 A1* | 1/2007 | Tanaka et al. ................. 257/295 |
| 2007/0026645 A1* | 2/2007 | Lieber et al. ................... 438/478 |
| 2007/0059877 A1* | 3/2007 | Koo et al. ...................... 438/213 |
| 2008/0049489 A1* | 2/2008 | Johnson ......................... 365/158 |
| 2008/0239930 A1* | 10/2008 | Saito et al. ..................... 369/126 |
| 2009/0121267 A1* | 5/2009 | Hong et al. .................... 257/295 |
| 2010/0176428 A1* | 7/2010 | Hong et al. .................... 257/295 |
| 2010/0213519 A1* | 8/2010 | Sasaki et al. ................... 257/295 |
| 2010/0244897 A1* | 9/2010 | Saito et al. ...................... 326/49 |
| 2010/0264475 A1* | 10/2010 | Worledge ....................... 257/295 |
| 2010/0271112 A1* | 10/2010 | Hong et al. .................... 327/534 |
| 2010/0327333 A1* | 12/2010 | Sasaki et al. ................... 257/295 |
| 2011/0042648 A1* | 2/2011 | Koo et al. ......................... 257/24 |
| 2011/0042720 A1* | 2/2011 | Jalil et al. ....................... 257/194 |
| 2011/0147816 A1* | 6/2011 | Nikonov et al. ............... 257/295 |
| 2011/0204886 A1* | 8/2011 | Sasaki et al. ................... 324/244 |
| 2011/0244268 A1* | 10/2011 | Sasaki ............................ 428/812 |
| 2011/0273925 A1* | 11/2011 | Yamamoto et al. ............ 365/154 |
| 2011/0279146 A1* | 11/2011 | Koo et al. ....................... 326/100 |
| 2011/0284937 A1* | 11/2011 | Kim et al. ....................... 257/295 |
| 2011/0292714 A1* | 12/2011 | Andre et al. ................... 365/148 |
| 2011/0292718 A1* | 12/2011 | Suzuki et al. .................. 365/158 |
| 2012/0176154 A1* | 7/2012 | Behin-Aein et al. ............ 326/37 |
| 2012/0217993 A1* | 8/2012 | Nikonov et al. ................. 326/35 |

* cited by examiner

RECONFIGURABLE LOGIC DEVICE USING SPIN ACCUMULATION AND DIFFUSION

CROSS-REFERENCE TO RELATED APPLICATIONS

This application claims the priority of Korean Patent Application No. 2009-0077622 filed on Aug. 21, 2009, in the Korean Intellectual Property Office, the disclosure of which is incorporated herein by reference.

BACKGROUND OF THE INVENTION

1. Field of the Invention

The present invention relates to a logic device and, more particularly, to a spin element-based logic device capable of implementing a logic gate having various functions even with a small device area by using spin information transferred from a ferromagnetic material to a channel.

2. Description of the Related Art

A semiconductor logic circuit, employed for most electronic devices, is one of the most significant and highly value added sectors of the global electronics industry, in which research is actively ongoing. A currently used logic circuit must be combined to have different structures according to various types of calculations, and in order to perform a specific type of calculation, the logic circuit may have an extremely complicated structure. Recently, the most critical requirements for semiconductor devices are the reduction of size and the introduction of multi-functionality. These two requirements are associated, and a logic circuit using an existing MOSFET (Metal Oxide Semiconductor Field Effect Transistor) has almost reached its physical limitation in terms of area reduction, making it difficult to configure a multi-functional logic circuit.

SUMMARY OF THE INVENTION

An aspect of the present invention provides a logic device capable of implementing a multi-functional logic gate with a small area by using spin information transferred from a ferromagnetic material to a channel.

According to an aspect of the present invention, there is provided a logic device including: a substrate having a channel layer; two input terminal patterns of ferromagnetic material formed on the substrate and spaced apart from each other along a longitudinal direction of the channel layer to serve as input terminals of a logic gate; and an output terminal pattern of ferromagnetic material formed on the substrate and disposed between the two input terminal patterns to serve as an output terminal of the logic gate. An output voltage is read from the output terminal pattern by using spin accumulation and diffusion of electrons which are injected into the channel layer from the input terminal patterns.

An input value input by the input terminal patterns may be determined by a magnetization direction of the input terminal patterns.

The function of the logic device may be assigned to one of AND, OR, NOR, and NAND gates by changing the magnetization direction of the output terminal pattern and a reference voltage.

The output terminal pattern of ferromagnetic material may detect spin information obtained as electron spin is accumulated under the two input terminal patterns and diffused to the output terminal through a channel so as to be added.

The logic device may further include two non-magnetic electrodes separated from an outer side of the input terminal patterns and disposed at the opposite side of the output terminal pattern. An input current may flow from the input terminal patterns to the electrodes via the channel layer.

The space between the non-magnetic electrode and the input terminal pattern adjacent to each other may be narrower than the space between the input terminal pattern and the output terminal pattern in order to restrain current from flowing from the input terminal patterns to the output terminal pattern.

The channel layer may have a wider width at the outer side of the input terminal patterns than at a central portion where the output terminal pattern is disposed.

At least one of the input terminal patterns and the output terminal pattern may be made of material selected from the group consisting of CoFe, Co, Ni, NiFe, and combinations thereof.

At least one of the input terminal patterns and the output terminal pattern may be made of a magnetic semiconductor selected from the group consisting of (Ga,Mn)As, (In,Mn)As, and combinations thereof.

The channel layer may be a two-dimensional electron gas layer. The two-dimensional electron gas layer may be made of a material selected from the group consisting of GaAs, InAs, InGaAs, InSb, and combinations thereof.

The channel layer may be made of a material selected from the group consisting of n-doped GaAs, InAs, InGaAs, and InSb, the substrate may include an upper layer formed on the channel layer, and the upper layer may be ohmic or Schottky-contacted with the input terminal patterns and the output terminal pattern.

The substrate may include an Si substrate, and the channel layer may be formed on the Si substrate. The channel layer may be a metal or a semi-metal selected from the group consisting of Au, Pt, Ag, Al, Cu, Sb, and combinations thereof. The substrate may further include an insulating layer formed between the Si substrate and the channel layer. The insulating layer may be selected from the group consisting of $SiO_2$, $Al_2O_3$, $TaO_x$, MgO, and combinations thereof. The channel layer may be graphene or nano-wire formed on the Si substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

The exemplary embodiments of the present invention are based on the use of spin information, which is transferred from a ferromagnetic substance to a channel, for a logic gate. An input signal is determined by magnetization directions of two input terminal patterns which are made of ferromagnetic material. An output voltage is read by an output terminal pattern of ferromagnetic material positioned between two input terminals. The function of the logic gate can be changed according to the magnetization direction of the output terminal pattern. Transmission of spin information is made by an accumulation and diffusion phenomenon of spin. The logic gate can be implemented to have four functions with a single device by changing the magnetization direction of the output terminal pattern and a reference potential that determines an output value. Compared with an existing semiconductor device which merely uses electric charges, the spin device using electron spin can control and use both electronic charges and spin and thus can be very suitable for the realization of a multi-functional logic circuit.

Exemplary embodiments of the present invention will now be described in detail with reference to the accompanying drawings. The invention may however be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 1:
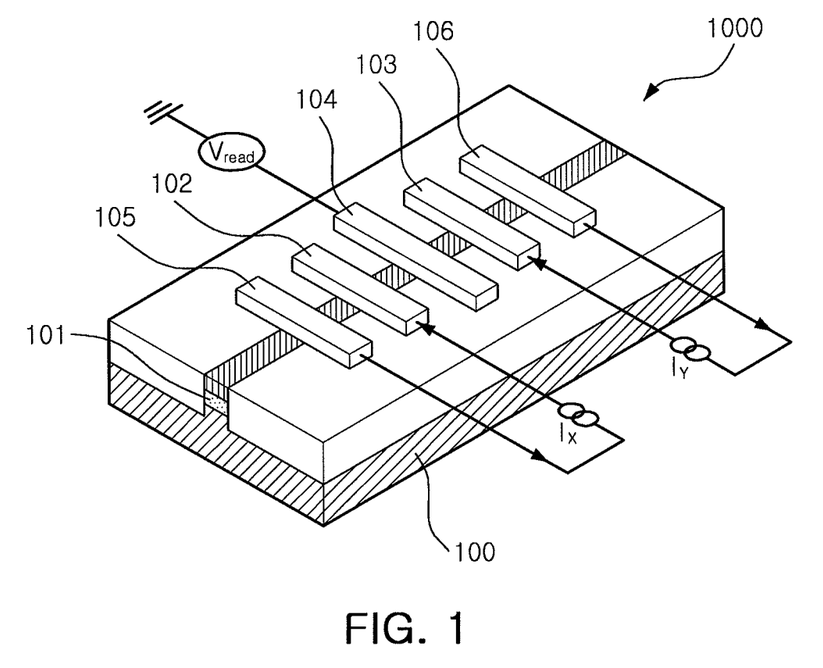
FIG. 1 is a perspective view of a logic device according to an exemplary embodiment of the present invention.

With reference to FIG. 1, a logic device 1000 according to an exemplary embodiment of the present invention includes a semiconductor substrate 100 having a channel layer 101, ferromagnetic patterns 102, 103, and 104, and electrodes 105 and 106. The logic device has two input terminals 102 and 103 and one output terminal pattern 104. Input currents Ix and Iy flow from the two input terminal patterns 102 and 103 of ferromagnetic material to the electrodes 105 and 106 via the channel layer 101, and an output voltage is read by the output terminal pattern 104 of ferromagnetic material located at the center. The two input terminal patterns 102 and 103 are spaced apart from each other along a longitudinal direction of the channel layer, serving as the input terminals of a logic gate. The logic device 1000 may implement a logic gate having four functions (to be described with reference to FIGS. 2 to 5).

Figure 2A:
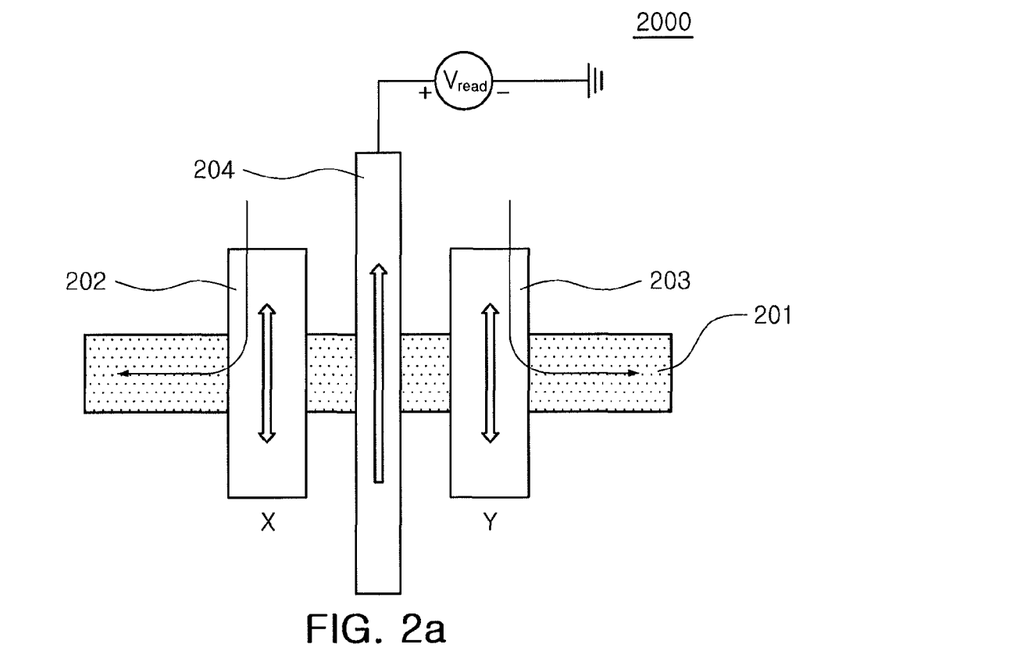
FIGS. 2a and 2b are views for explaining an operational principle of an OR gate according to an exemplary embodiment of the present invention.
Figure 2B:
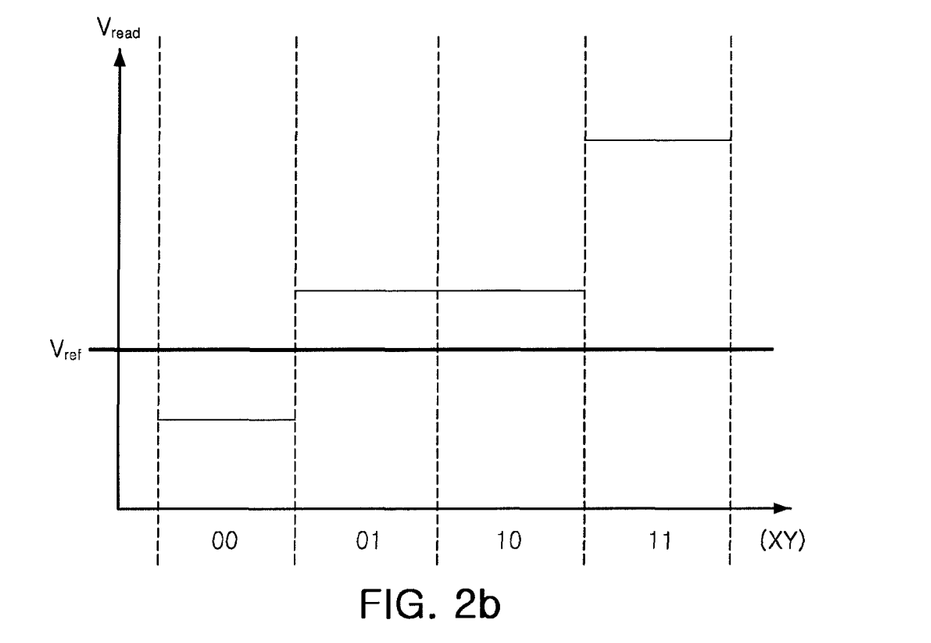

FIG. 2a illustrates an operation of an OR gate 2000. Down-spin is defined as 0 and up-spin is defined as 1, and input terminals are formed as two ferromagnetic material patterns 202 and 203. If the input values of the two input terminal patterns 202 and 203 are X and Y, the input values X and Y are determined as magnetization directions of the input terminal patterns of ferromagnetic material. For example, if X=0 and Y=0, down-spin is injected into the channel layer 201 from the two input terminal patterns 202 and 203 and accumulated under the input terminals, and is diffused to the middle output terminal pattern 204 which is formed of ferromagnetic material. In this case, because the output terminal pattern 204 of ferromagnetic material has been magnetized as up-spin, a low voltage value as shown in FIG. 2b is read. If the magnetization direction of the output terminal pattern 204 and the direction of the spin diffused to reach the output terminal pattern 204 are the same, the output terminal pattern 204 has a high potential, whereas if the directions are opposed to one another, the output terminal pattern 204 has a low potential. Here, if one of X and Y is changed to 1, up-spin is injected to a point of the input terminal where the input value is 1, and the up-spin and down-spin are canceled out at the output terminal pattern 204, so the voltage has a middle value without spin polarized electrons. In the case of X=Y=1, only up-spin is diffused to reach the output terminal pattern 204, so a high voltage value can be read. Output voltages ($V_{read}$) according to each input value are as shown in FIG. 2b. If high and low levels are defined by using a reference potential ($V_{ref}$) (if the output voltage ($V_{read}$) is higher than the reference potential ($V_{ref}$), a high level signal is output, whereas if the output voltage ($V_{read}$) is lower than the reference potential ($V_{ref}$), a low level signal is output), all the output values, except for the case where X=Y=0, have the high value, implementing the OR gate. Determination of the reference potential (Vref)) may be regulated through a simple circuit.

Figure 3A:
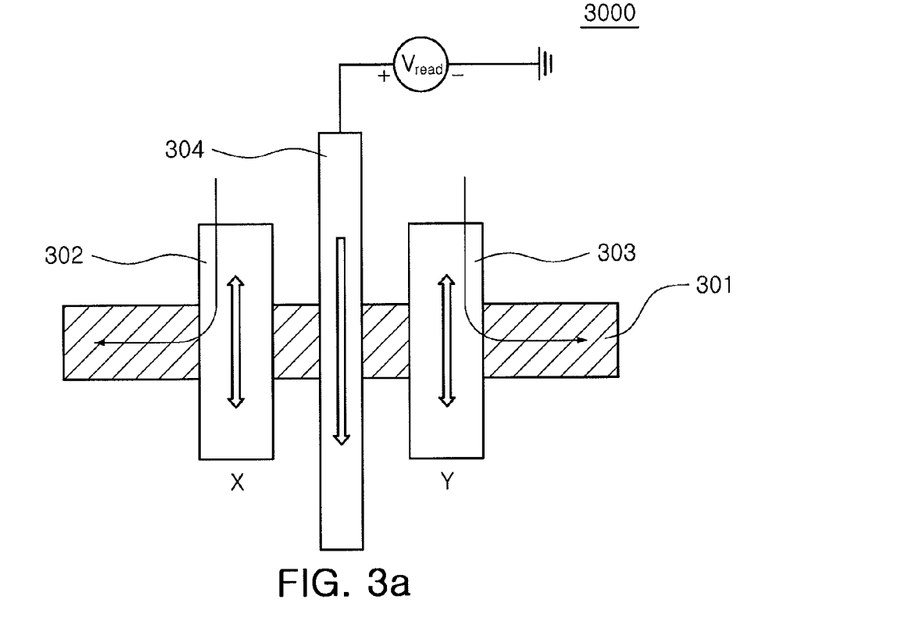
FIGS. 3a and 3b are views for explaining an operational principle of a NAND gate according to an exemplary embodiment of the present invention.
Figure 3B:
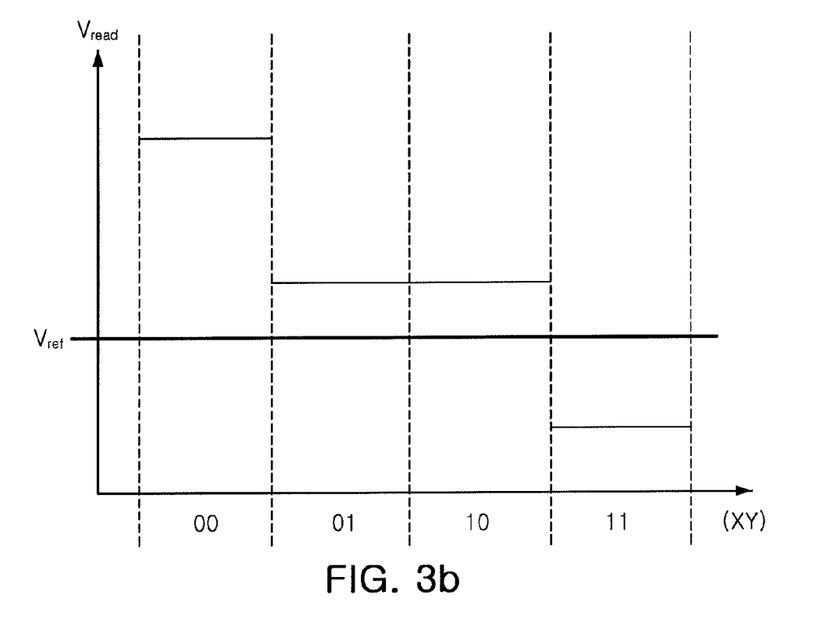

FIG. 3a illustrates an operation of a NAND gate 3000. The principle of reading the spin-polarized electron spin of the input terminal patterns 302 and 303 of ferromagnetic material at the output terminal pattern 304 of ferromagnetic material through a channel layer 301 is the same as that of the OR gate as described above. In order to implement the NAND gate, only the output terminal pattern of the above-described OR gate may need to be magnetized to down-spin, not up-spin. For example, if X=0 and Y=0, down-spin is injected from the two input terminal patterns 302 and 303 and accumulated to be diffused to the middle output terminal pattern 304. In this case, because the output terminal pattern 304 has been magnetized with down-spin, it has a high voltage value as shown in FIG. 3b. Here, if one of X and Y is changed to 1, up-spin is injected to a point of the input terminal where the input value is 1, and the up-spin and down-spin are canceled out at the output terminal pattern 304, so the voltage has a middle value without spin polarized electrons. In case of X=Y=1, only up-spin is diffused to the output terminal pattern 304, so a low voltage value can be read from the output terminal pattern 304. Output voltages with respect to each input value are as shown in FIG. 3b. If high and low levels are defined by using a reference potential ($V_{ref}$), all the output values have the logical value as shown in FIG. 3b, implementing the NAND gate.

Figure 4:
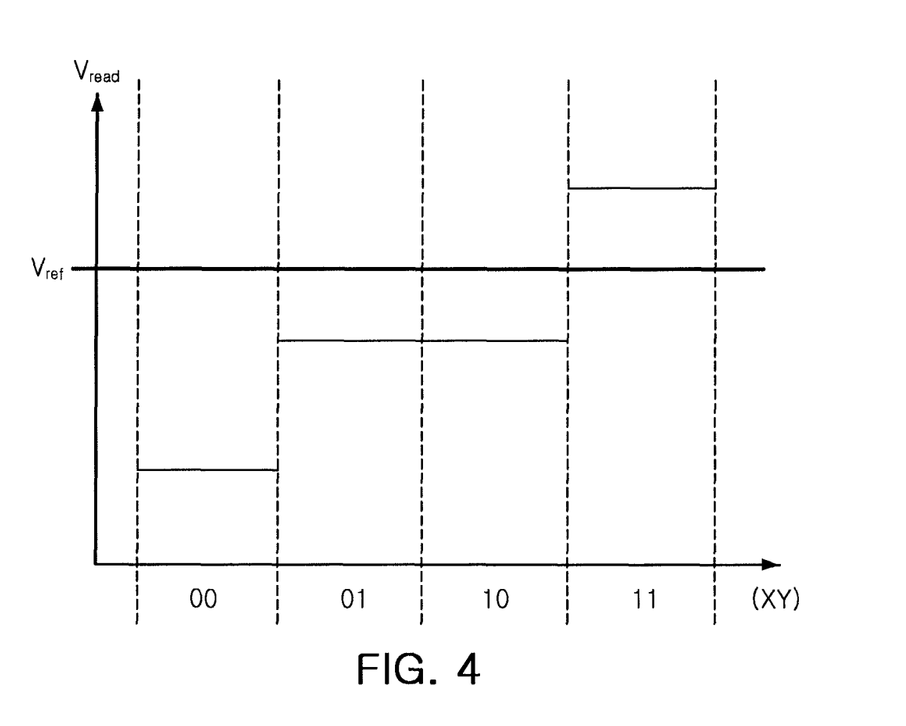
FIG. 4 is a view for explaining an operational principle of an AND gate according to an exemplary embodiment of the present invention.

FIG. 4 illustrates an operation of an AND gate. A basic device structure and output potentials with respect to each input value in the exemplary embodiment of FIG. 4 are the same as those of the OR gate illustrated in FIGS. 2a and 2b. In this case, however, when high and low levels are defined based on the reference potential ($V_{ref}$) as shown in FIG. 4 (namely, if the reference ($V_{ref}$) is determined to be lower than an output potential in case of (XY)=(11) but higher than output potentials in case of (XY)=(10) and (XY)=(01)), the AND gate is implemented.

Figure 5:
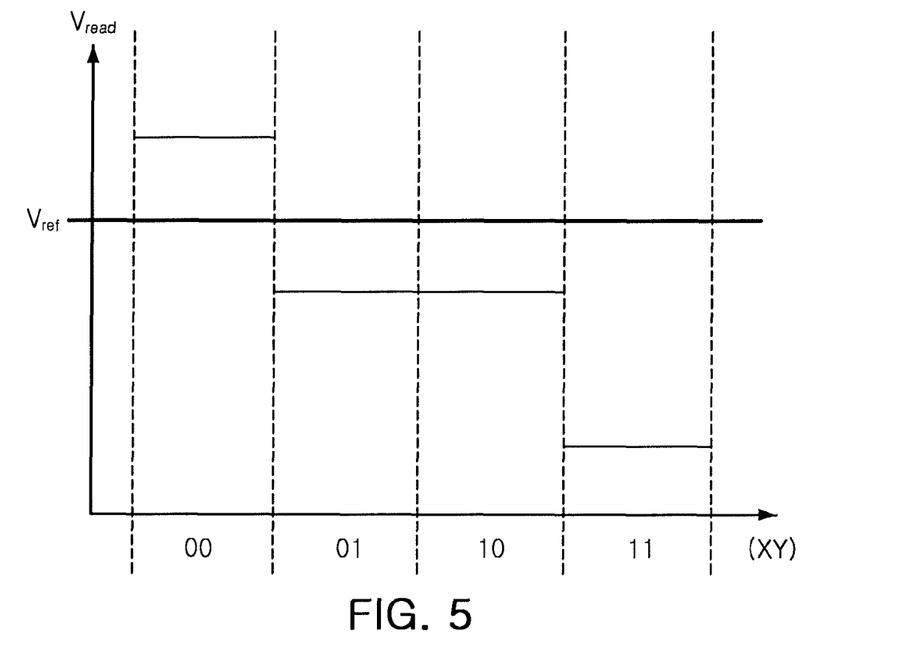
FIG. 5 is a view for explaining an operational principle of a NOR gate according to an exemplary embodiment of the present invention.

FIG. 5 illustrates an operation of a NOR gate. A basic device structure and output potentials with respect to each input value in the exemplary embodiment of FIG. 5 are the same as those of the NAND gate illustrated in FIGS. 3a and 3b. In this case, however, when high and low levels are defined based on the reference potential ($V_{ref}$) as shown in FIG. 5 (namely, if the reference ($V_{ref}$) is determined to be lower than an output potential in case of (XY)=(00) but higher than output potentials in case of (XY)=(10) and (XY)=(01)), the logical value as shown in FIG. 5 is obtained, implementing the NOR gate.

As described above with reference to FIGS. 2 to 5, it is noted that the logic gates (OR, NAND, AND and NOR gates) of the four types of functions can be implemented by using a single device by changing the magnetization direction at the output terminal pattern and the reference potential ($V_{ref}$).

Figure 6:
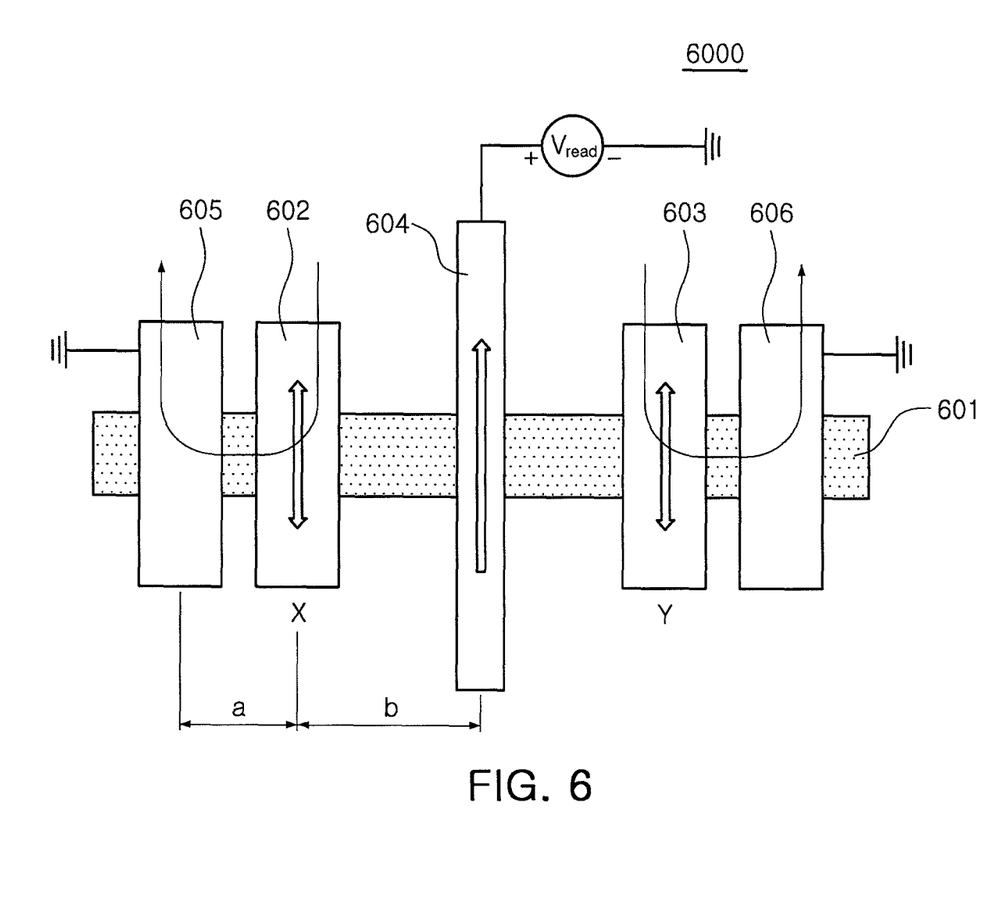
FIG. 6 is a plan view of a logic device in which electrodes are disposed near input terminals to prevent a leakage current toward a central region according to an exemplary embodiment of the present invention.

FIG. 6 is a plan view of a logic device 6000 according to an exemplary embodiment of the present invention. In the configuration of the logic circuit, it is desirous to prevent an interference caused as the current of input terminals 602 and 603 of ferromagnetic material flows to the central output terminal pattern 604 of ferromagnetic material. In the exemplary embodiment of FIG. 6, non-magnetic metal patterns 605 and 606 are positioned as electrodes near the input terminal patterns 602 and 603 of ferromagnetic material. A space (a) between the input terminal pattern 602 or 603 and the non-magnetic metal pattern 605 or 606 adjacent to each other is narrower than a space (b) between either of the input terminal patterns 602 and 603 and the output terminal pattern 604. In this structure, the current of the input terminals 602 and 603 flows to the neighboring metal patterns 605 and 606, without any current leakage to the central part (output terminal side) of the device.

Figure 7:
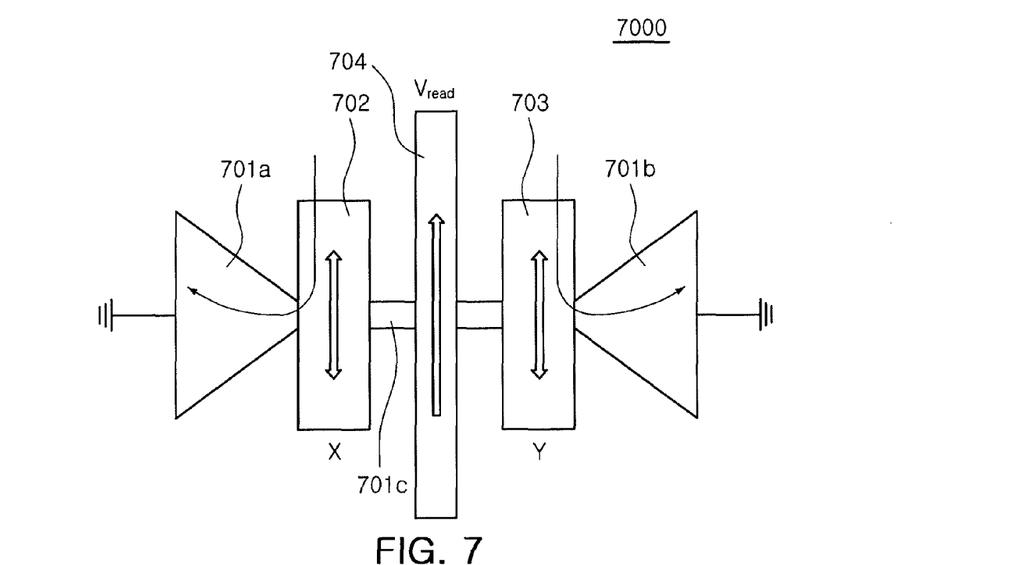
FIG. 7 is a plan view of a logic device in which the shape of channels is modified to prevent a leakage current toward a central region according to an exemplary embodiment of the present invention.

FIG. 7 illustrates a logic device 7000 in which current from the input terminals 702 and 703 is prevented from flowing to a central output terminal pattern 704 according to an exemplary embodiment of the present invention. A channel width at both end channel regions 701a and 701b is gradually increased to make resistance smaller than that at a central portion of a channel region 701c. Then, most current flows to the both ends, rather than flowing to the central portion.

Figure 8A:
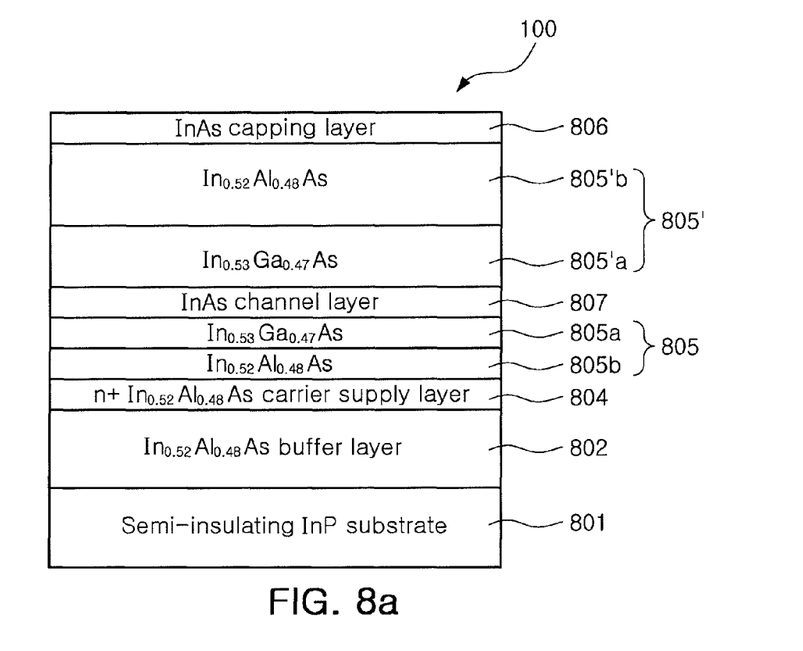
FIGS. 8a to 8c are sectional views showing various channel structures provided in the logic device according to the exemplary embodiments of the present invention.

FIG. 8a is a sectional view of a semiconductor substrate having a spin channel including two-dimensional electronic gas used for a channel according to an exemplary embodiment of the present invention. With reference to FIG. 8a, the semiconductor substrate 100 includes an InAlAs buffer layer 802, an n-doped InAlAs carrier supply layer 804, an undoped InGaAs/InAlAs lower cladding layer 805, an InAs channel layer 807, an undoped InAlAs/InGaAs upper cladding layer 805', and an InAs capping layer 806 which are sequentially stacked on a semi-insulating InP substrate 801.

The lower and upper cladding layers 805 and 805' have a dual-cladding structure including an undoped InGaAs layer and an InAlAs layer, respectively. Namely, the lower cladding layer 805 includes a first lower cladding layer 805a including InGaAs, and a second lower cladding layer 805b formed below the first lower cladding layer 805a and including InAlAs. The upper cladding layer 805' includes a first upper cladding layer 805a' including InGaAs, and a second upper cladding layer 805b' formed on the first upper cladding layer 805a' and including InAlAs. The second lower cladding layer 805b has an energy band gap larger than that of the first lower cladding layer 805a, and the second upper cladding layer 805b' has an energy band gap larger than that of the first upper cladding layer 805a'.

The channel layer 807 forms a quantum well by an energy barrier of the upper and lower cladding layers 805 and 805'. In particular, electrons are confined in the channel layer 807 by the upper and lower cladding layers 805 and 805' having the dual-cladding structure, and the channel layer 807 forms two-dimensional electron gas (2-DEG) layer. In such a two-dimensional electron gas layer, electron mobility is very high in order to increase a spin transmission distance. In the present exemplary embodiment, InAs is used as the channel layer 807, however, the present invention is not meant to be limited thereto. For example, a semiconductor material selected from among GaAs, InGaAs, InSb, InAs and combinations thereof may be used as a material of the channel layer having the two-dimensional electron gas structure.

The n-doped InAlAs carrier supply layer 804 is formed below the channel layer 807 and supplies electric charges to the channel layer 807. The InAlAs buffer layer 802 reduces latitude non-uniformity between the InP substrate 801 and the lower cladding layer 805. The InAs capping layer 806 which is disposed at the top of the semiconductor substrate 100 serves to prevent oxidization and degeneration of the semiconductor substrate possibly caused during a process.

Figure 8B:
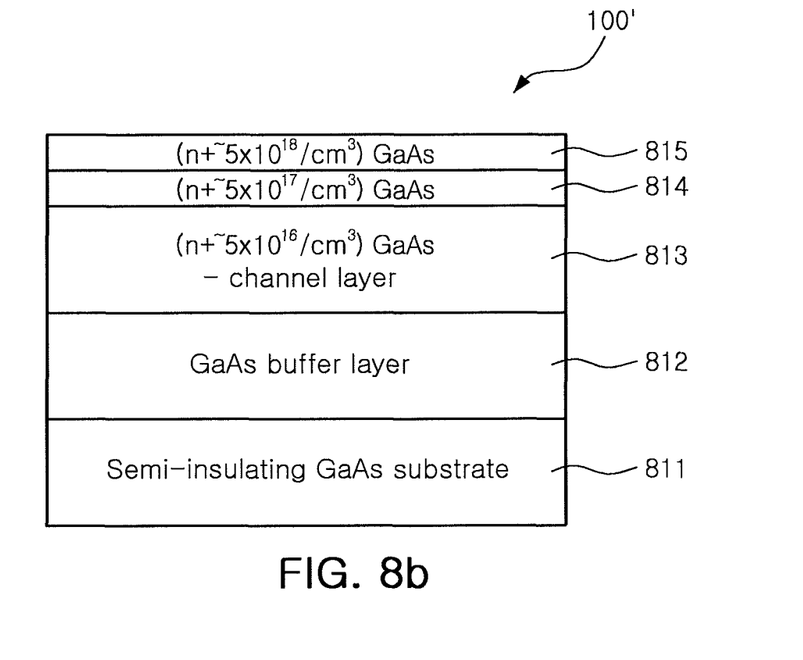

FIG. 8b illustrates the structure of a semiconductor substrate having a channel layer according to another exemplary embodiment of the present invention. A semiconductor substrate 100' includes a buffer layer 812 and a channel layer 813 sequentially formed on a GaAs substrate 811. Upper layers 814 and 815 are used to form a Schottky barrier with a ferromagnetic substance (input and output terminal patterns) disposed on the semiconductor substrate 100', and the channel layer 813 is a GaAs layer having a doping density lower than that of the upper layers 814 and 815. For the channel layer 813, InGaAs may be used instead of GaAs. The thickness of each layer proposed in the present exemplary embodiment may vary according to purpose. In FIG. 8b, the channel layer 813 may be formed by using a semiconductor material selected from among InAs, InGaAs, InSb, and combinations thereof, instead of GaAs, and the semiconductor substrate 100' may form an ohmic or Schottky contact with the ferromagnetic substance disposed thereon.

Figure 8C:
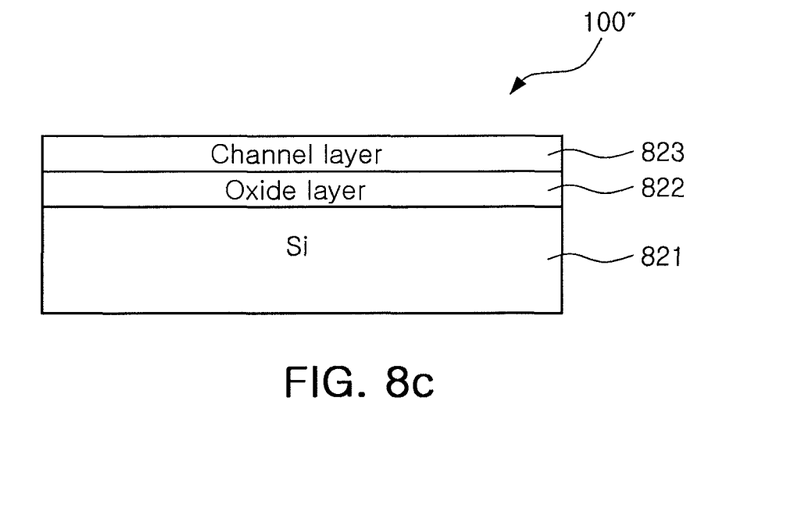

FIG. 8c is a sectional view of a substrate 100" having a spin channel 823 formed as a single layer used for a logic device according to another exemplary embodiment of the present invention. Any metal, semiconductor, semimetal that generates a Spin Hall Effect can be used as the channel. Materials used for a metal channel may include Au, Pt, Ag, Al, Cu, etc., and semi-metals may include Sb, and the semiconductor may include GaAs, InAs, InGaAs, and InSb. As shown in FIG. 8c, an insulator such as an oxide layer 822 may be interposed between the channel 823 and an Si substrate 821, and in this case, $Al_2O_3$, MgO, $TaO_x$, and $SiO_2$ may be used as the insulator, and the insulator (i.e., the oxide layer 822) may be omitted. Also, grapheme or nano-wire may be used as the channel 823.

As set forth above, according to exemplary embodiments of the invention, the logic gate having four functions with a single device can be implemented by changing a magnetization direction of an output terminal pattern and a reference potential by using the accumulation and diffusion of electron spin generated from a ferromagnetic substance. Accordingly, a multi-functional logic circuit can be easily implemented while reducing the device area.

While the present invention has been shown and described in connection with the exemplary embodiments, it will be apparent to those skilled in the art that modifications and variations can be made without departing from the spirit and scope of the invention as defined by the appended claims.

What is claimed is:
1. A logic device comprising:
    a substrate having a channel layer;
        two input terminal patterns of ferromagnetic material formed on the substrate and spaced apart from each other along a longitudinal direction of the channel layer to serve as input terminals of a logic gate;

an output terminal pattern of ferromagnetic material formed on the substrate and disposed between the two input terminal patterns to serve as an output terminal of the logic gate;

a reader configured for reading an output voltage from the output terminal pattern by using spin accumulation and diffusion of electrons which are injected into the channel layer from the input terminal patterns; and two non-magnetic electrodes separated from respective outer sides of the two input terminal patterns and disposed at an opposite side of the output terminal pattern, wherein an input current flows from the input terminal patterns to the non-magnetic electrodes via the channel layer.

2. The logic device of claim 1, wherein an input value input by the input terminal patterns is determined by a magnetization direction of the input terminal patterns.

3. The logic device of claim 1, wherein the function of the logic device is assigned to one of AND, OR, NOR, and NAND gates by changing a magnetization direction of the output terminal pattern and a reference voltage.

4. The logic device of claim 1, wherein the output terminal pattern detects spin information obtained as electron spins are accumulated under the two input terminal patterns and diffused to the output terminal pattern through a channel so as to be added.

5. The logic device of claim 1, wherein the space between the non-magnetic electrode and the input terminal pattern adjacent to each other is narrower than the space between the input terminal pattern and the output terminal pattern.

6. The logic device of claim 1, wherein the channel layer has a wider width at the outer sides of the input terminal patterns than at a central portion where the output terminal pattern is disposed.

7. The logic device of claim 1, wherein at least one of the input terminal patterns and the output terminal pattern is made of material selected from the group consisting of CoFe, Co, Ni, NiFe, and combinations thereof.

8. The logic device of claim 1, wherein at least one of the input terminal patterns and the output terminal pattern is a magnetic semiconductor selected from the group consisting of (Ga,Mn)As, (In,Mn)As, and combinations thereof.

9. The logic device of claim 1, wherein the channel layer is a two-dimensional electron gas layer.

10. The logic device of claim 9, wherein the two-dimensional electron gas layer is made of a material selected from the group consisting of GaAs, InAs, InGaAs, InSb, and combinations thereof.

11. The logic device of claim 1, wherein the channel layer is made of a material selected from the group consisting of n-doped GaAs, InAs, InGaAs, and InSb, the substrate includes an upper layer formed on the channel layer, and the upper layer is ohmic or Schottky-contacted with the input terminal patterns and the output terminal pattern.

12. The logic device of claim 1, wherein the substrate comprises an Si substrate, and the channel layer is formed on the Si substrate.

13. The logic device of claim 12, wherein the channel layer is a metal or a semi-metal selected from the group consisting of Au, Pt, Ag, Al, Cu, Sb, and combinations thereof.

14. The logic device of claim 12, wherein the channel layer is formed of graphene or nano-wire.

15. The logic device of claim 12, wherein the substrate further comprises an insulating layer formed between the Si substrate and the channel layer.

16. The logic device of claim 15, wherein the insulating layer is selected from the group consisting of $SiO_2$, $Al_2O_3$, $TaO_x$, MgO, and combinations thereof.

* * * * *